US011451049B2

(12) United States Patent
Cho et al.

(10) Patent No.: US 11,451,049 B2
(45) Date of Patent: Sep. 20, 2022

(54) DEVICE FOR MAINTAINING OPERATING STATE OF CONTACTOR

(71) Applicant: Samsung SDI Co., Ltd., Yongin-si (KR)

(72) Inventors: Kyu Sung Cho, Yongin-si (KR); Sang Taek Han, Yongin-si (KR); Seung Ho Han, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 140 days.

(21) Appl. No.: 17/081,781

(22) Filed: Oct. 27, 2020

(65) Prior Publication Data
US 2021/0151982 A1 May 20, 2021

(30) Foreign Application Priority Data
Nov. 15, 2019 (KR) .................... 10-2019-0146631

(51) Int. Cl.
*H02H 7/22* (2006.01)
*H02H 1/00* (2006.01)
*H03K 19/0175* (2006.01)
*H03K 19/20* (2006.01)

(52) U.S. Cl.
CPC .......... *H02H 7/222* (2013.01); *H02H 1/0007* (2013.01); *H03K 19/017509* (2013.01); *H03K 19/20* (2013.01)

(58) Field of Classification Search
CPC .... H01H 47/002; H01H 47/04; H02H 1/0007; H02H 7/222; H03K 19/017509; H03K 19/20; Y02T 10/70
(Continued)

(56) References Cited

U.S. PATENT DOCUMENTS 7,521,824 B2   4/2009  Osawa
9,525,291 B1 * 12/2016  Huynh .................. B60L 3/04
(Continued)

FOREIGN PATENT DOCUMENTS

EP   3385108 A1   10/2018
JP   0793764 B2 * 10/1995 .......... B60L 11/1805
(Continued)

OTHER PUBLICATIONS

EPO Extended European Search Report dated Apr. 6, 2021, issued in corresponding European Patent Application No. 20205130.6 (5 pages).
(Continued)

*Primary Examiner* — Kevin J Comber
(74) *Attorney, Agent, or Firm* — Lewis Roca Rothgerber Christie LLP

(57) ABSTRACT

A device includes: a controller configured to output a contactor control signal for controlling an operation of a contactor; a system basis unit configured to monitor a state of the controller and to output a safety detection signal; an operation maintaining unit including a first level shifter configured to shift a voltage level of the safety detection signal, a second level shifter configured to shift a voltage level of the contactor control signal, a retention output unit configured to compare the voltage level of the first level shifter with the voltage level of the second level shifter and to output a retention output signal, and a timer output unit configured to output a timer output signal to output the retention output signal for a preset time; and a contactor driver configured to output a contactor driving signal based on the contactor control signal and the retention output signal.

8 Claims, 4 Drawing Sheets

(58) Field of Classification Search
USPC .......................................................... 361/86
See application file for complete search history.

(56) References Cited

U.S. PATENT DOCUMENTS

| | | | |
|---|---|---|---|
| 10,746,802 B2 | 8/2020 | Cho et al. | |
| 2006/0087775 A1 | 4/2006 | Osawa | |
| 2014/0176033 A1 | 6/2014 | Heo et al. | |
| 2018/0186241 A1* | 7/2018 | Harvey | B60L 3/12 |
| 2020/0124672 A1* | 4/2020 | Cho | G01R 31/00 |

FOREIGN PATENT DOCUMENTS

| | | |
|---|---|---|
| JP | 3493249 B2 | 2/2004 |
| JP | 2006-121865 A | 5/2006 |
| JP | 2016-178793 A | 10/2016 |
| JP | 2018-143014 A | 9/2018 |
| KR | 1999-027244 A | 4/1999 |
| KR | 10-2014-0081092 A | 7/2014 |
| KR | 10-2017-0097481 A | 8/2017 |
| KR | 10-2018-0008224 A | 1/2018 |
| KR | 10-2020-0092208 A | 8/2020 |

OTHER PUBLICATIONS

Korean Office Action dated Jan. 27, 2021, issued in corresponding Korean Patent Application No. 10-2019-0146631 (4 pages).
Korean Notice of Allowance dated Aug. 10, 2021, issued in corresponding Korean Patent Application No. 10-2019-0146631 (2 pages).

* cited by examiner

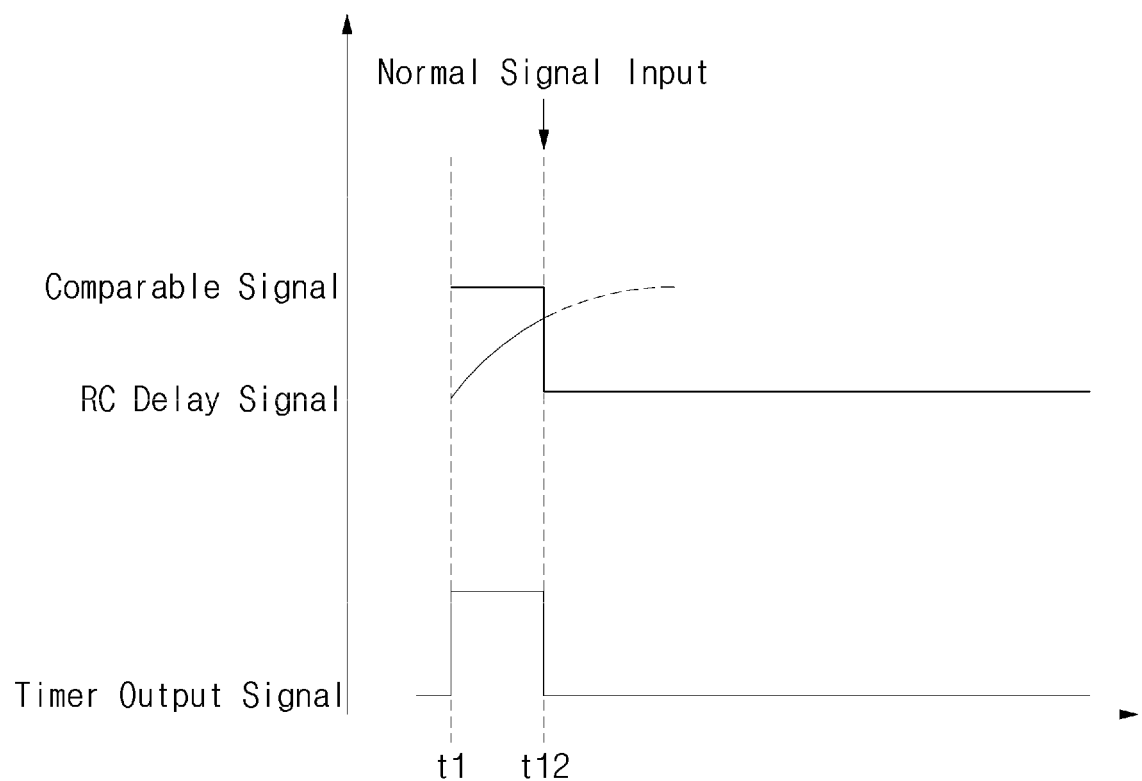

DEVICE FOR MAINTAINING OPERATING STATE OF CONTACTOR

CROSS-REFERENCE TO RELATED APPLICATION

The present application claims priority to and the benefit of Korean Patent Application No. 10-2019-0146631 filed on Nov. 15, 2019 in the Korean Intellectual Property Office, the entire content of which is herein incorporated by reference.

BACKGROUND

1. Field

Aspects of some example embodiments of the present disclosure relate to a device for maintaining the operating state of a contactor.

2. Description of the Related Art

With the technological development of electric automobiles and energy storage devices, technologies related with battery packs are actively being developed. In order to drive devices driven by the battery packs, it may be desirable for the battery packs to have relatively high voltages and capacities.

Such battery packs may be connected to an electronic device by means of a relay to drive the electronic device. When an abnormality occurs in a system or component of the electronic device, a control signal for controlling the relay may not be properly maintained, which may lead to a serious accident.

For example, when a controller for controlling a relay is reset due to the occurrence of an abnormality in a battery-driven electric vehicle, an electrical connection between a battery pack and a vehicle body may be disconnected in an unintended manner. In a case where the vehicle runs at high speeds, the electrical disconnection may give rise to a disastrous and/or dangerous accident.

The above information disclosed in this Background section is only for enhancement of understanding of the background and therefore the information discussed in this Background section does not necessarily constitute prior art.

SUMMARY

Aspects of some example embodiments of the present disclosure include a device for maintaining the operating state of a contactor, which is capable of improving reliability by preventing the contactor from being at an unintended open state by maintaining an operating state of the contactor even when an abnormality occurs to a controller controlling the contactor.

These and other aspects and characteristics of embodiments according to the present disclosure will be described in or will be apparent from the following description of example embodiments of the present disclosure.

According to some example embodiments of the present disclosure, in a device for maintaining the operating state of a contactor, the contactor operating state maintaining device includes a controller which outputs a contactor control signal for controlling the operation of the contactor, a system basis unit which monitors a state of the controller and outputs a safety detection signal, an operation maintaining unit which includes a first level shifter shifting a voltage level of the safety detection signal, a second level shifter shifting a voltage level of the contactor control signal, a retention output unit comparing the voltage level of the first level shifter with the voltage level of the second level shifter and outputting a retention output signal, and a timer output unit which output a timer output signal to output the retention output signal for a preset time, and a contactor driver which outputs a contactor driving signal based on the contactor control signal and the retention output signal.

According to some example embodiments, the first level shifter may set the voltage level of the safety detection signal to be higher than that of the contactor control signal and lower than a power voltage level, and may set the retention output unit to be always at an OFF state when the safety detection signal and the contactor control signal are both at a high level.

According to some example embodiments, when the retention output unit is turned on to output the retention output signal, the second level shifter may up-shift the voltage level of the contactor control signal to the power voltage level to set the retention output unit to be always at an ON state.

According to some example embodiments, the second level shifter may delay the contactor control signal.

According to some example embodiments, when an abnormality occurs to the controller, the contactor control signal may be converted from high to low, the system basis unit may sense the conversion to then convert the safety detection signal from high to low, and the retention output unit may output the retention output signal as a high level signal.

According to some example embodiments, the contactor operating state maintaining device may further include a timer actuating an RC timer based on the retention output signal and outputting an RC delay signal, and a third level shifter shifting a comparable signal level of the timer output unit based on the safety detection signal and the contactor control signal.

According to some example embodiments, when the abnormality of the controller is terminated while the timer is still operating, and the safety detection signal and the contactor control signal are both at a high level, the third level shifter may set the comparable signal level of the timer output unit to be lower than the level of the RC delay signal.

According to some example embodiments, in response to the comparable signal level of the timer output unit being lower than the RC delay signal level, the output of the timer output unit may be turned off and the output of the retention output unit may be interrupted.

According to some example embodiments, the contactor driver may perform an OR logic operation on the contactor control signal and the retention output signal and may output the contactor driving signal corresponding to a result of the OR logic operation.

As described above, the contactor operating state maintaining device according to various embodiments of the present disclosure can prevent or reduce instances of a contactor from being at an unintended open state by maintaining an operating state of the contactor even when an abnormality occurs to a controller controlling the contactor, thereby improving reliability.

In addition, the contactor operating state maintaining device according to some example embodiments of the present disclosure can recover a contactor controlling capacity of a controller by interrupting a retention function of an operation maintaining unit even before a preset time elapses, thereby enhancing system safety.

BRIEF DESCRIPTION OF DRAWINGS

FIGS. 4A and 4B are diagrams for explaining an operating state of a timer output unit according to some example embodiments.

DETAILED DESCRIPTION

Figure 1:
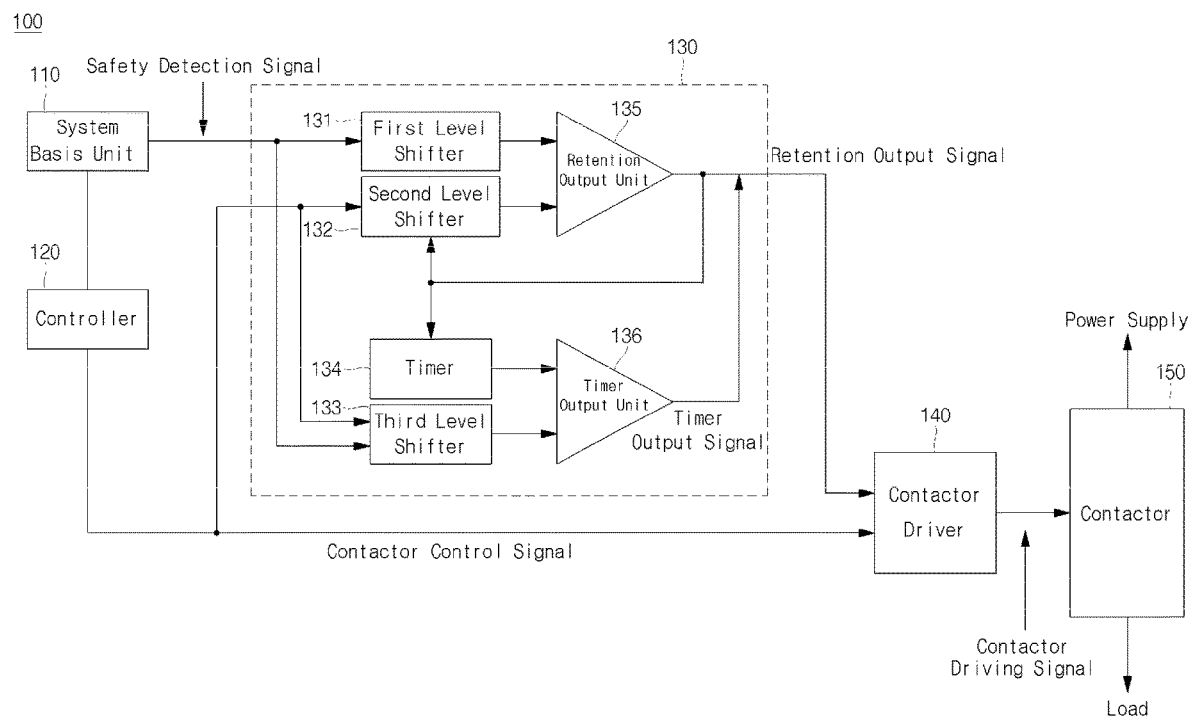
FIG. 1 is a block diagram of a contactor operating state maintaining device according to some example embodiments.

Hereinafter, aspects of some example embodiments of the present invention will be described in more detail.

Various embodiments of the present invention may be embodied in many different forms and should not be construed as being limited to the example embodiments set forth herein. Rather, these example embodiments of the invention are provided so that this invention will be more thorough and more complete and will convey inventive concepts of the invention to those skilled in the art.

In addition, in the accompanying drawings, sizes or thicknesses of various components are exaggerated for brevity and clarity. Like numbers refer to like elements throughout. As used herein, the term "and/or" includes any and all combinations of one or more of the associated listed items. In addition, it will be understood that when an element A is referred to as being "connected to" an element B, the element A can be directly connected to the element B or an intervening element C may be present and the element A and the element B are indirectly connected to each other.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprise or include" and/or "comprising or including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present invention.

In addition, the controller and/or any other relevant devices or components according to embodiments of the present disclosure described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the controller may be implemented on a flexible printed circuit film, a tape carrier package (TCP), a printed circuit board (PCB), or formed on the same substrate. Further, the various components of the controller may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the example embodiments of the present disclosure.

FIG. 1 is a block diagram of a contactor operating state maintaining device according to some example embodiments.

Referring to FIG. 1, the contactor operating state maintaining device 100 according to some example embodiments includes a system basis unit 110, a controller 120, an operation maintaining unit 130, a contactor driver 140, and a contactor 150.

The system basis unit 110 may supply power to the controller 120 and the operation maintaining unit 130. In addition, the system basis unit 110 may monitor a state of the controller 120, and, when an abnormality occurs, may notify the operation maintaining unit 130 of the occurrence of the abnormality. According to some example embodiments, the abnormality occurred to the controller 120 may mean a case in which the controller 120 is self-reset due to its internal error. According to some example embodiments, the system basis unit 110 may be implemented in the type of an integrated circuit (IC) called a system basis chip (SBC) having voltage power and communication bus interface and monitoring functions combined therein. In addition, the system basis unit 110 may monitor the state of the controller 120 to output a safety detection signal.

The controller 120 may be means for controlling the contactor 150 according to a control algorithm (e.g., a set or predetermined control algorithm). The controller 120 may include, for example, a data-processing device embedded in hardware, which has a circuit physically structured for performing functions represented as code or instructions included in a program. According to some example embodiments, the controller 120 may include all kinds of processing devices such as a microprocessor, a central processing unit (CPU), a processor core, a multiprocessor, an application-specific integrated circuit (ASIC), a field-programmable gate array (FPGA), and the like, but embodiments according to the present invention are not limited thereto.

The controller 120 may output a contactor control signal for controlling an operation of the contactor 150. The contactor control signal output from the controller 120 may be transferred to the contactor driver 140 and the operation maintaining unit 130. According to some example embodiments, the contactor control signal may include both an opening signal and a closing signal of the contactor 150. According to some example embodiments, the controller 120 may be self-reset due to its internal error. In this case, the controller 120 may not output the contactor control signal. Here, the system basis unit 110 may sense the occurrence of an abnormality from the controller 120 and may then actuate the operation maintaining unit 130.

The operation maintaining unit 130 is electrically connected to the system basis unit 110 and the controller 120. The operation maintaining unit 130 may function to maintain the operating state of the contactor 150 for a preset time even if an abnormality is generated in the controller 120. The operation maintaining unit 130 may receive from the system basis unit 110 a safety detection signal indicating that the controller 120 is in an abnormal state, and if there is no contactor control signal input from the controller 120, the operation maintaining unit 130 may output a retention output signal to the contactor driver 140 to maintain the operating state of the contactor 150. The operation maintaining unit 130 may include a first level shifter 131, a second level shifter 132, a third level shifter 133, a timer 134, a retention output unit 135, and a timer output unit 136, configurations and operations of the respective components of the operation maintaining unit 130 will be described below in further detail.

The first level shifter 131 may be configured by a combination of a resistor, a capacitor, and a transistor. The first level shifter 131 may shift a comparable voltage level of the retention output unit 135 based on the safety detection signal of the system basis unit 110.

The second level shifter 132 may be configured by a combination of a resistor, a capacitor, a diode, and a transistor. The second level shifter 132 may shift the voltage level of the contactor control signal based on the output signal of the retention output unit 135. In addition, the second level shifter 132 may operate as a buffer for delaying the contactor control signal.

The third level shifter 133 may be configured by a combination of a resistor, a capacitor, and a transistor. When the safety detection signal and the contactor control signal are both at a high level (a normal state), the third level shifter 133 may shift the comparable voltage level of the timer output unit 136. For example, when the operation maintaining unit 130 is maintained at an operating state due to the abnormal state of the controller 120 and the preset time has not elapsed, the controller 120 may return to a normal state. As such, the third level shifter 133 shifts the comparable voltage level of the timer output unit 136 when the safety detection signal and the contactor control signal are converted from low to high, the comparable voltage level of the timer output unit 136 is changed to thus interrupt the timer output signal, thereby allowing the retention output unit 135 to interrupt the retention output signal even if the preset time has not elapsed.

The timer 134 may be configured by a combination of a resistor, a capacitor, and a transistor (although some example embodiments may include fewer components or additional components without departing from the spirit and scope of embodiments according to the present disclosure). The timer 134 may start an RC timer operation based on the retention output signal of the retention output unit 135. In some examples, when the time set by the timer 134 elapses, the timer output signal is interrupted, and thus the retention output signal of the retention output unit 135 is also interrupted.

The retention output unit 135 may compare the voltage level of the first level shifter 131 with that of the second level shifter 132 to then output the retention output signal. According to some example embodiments, when the safety detection signal and the contactor control signal are both at a low level (an abnormal state), the retention output unit 135 may output the retention output signal. In addition, when the safety detection signal and the contactor control signal are both at a high level (a normal state), the retention output unit 135 may be set so as not to output the retention output signal.

The timer output unit 136 may be maintained to output the retention output signal for a period of the preset time by the retention output signal of the retention output unit 135. In addition, when the preset time elapses, the timer output unit 136 may interrupt the retention output signal. According to some example embodiments, when the RC timer starts to operate by the retention output signal, the timer output unit 136 may output the timer output signal as a high level signal, and after the preset time elapses, may output the timer output signal as a low level signal, to make the retention output signal go low. According to some example embodiments, when the RC timer starts to operate by the retention output signal, the timer output unit 136 may output the high-level timer output signal, and even if the preset time has not elapsed, the timer output signal may be shifted to a low level by the third level shifter 133, and thus the retention output signal may go to a low level.

The contactor driver 140 may receive output signals of the controller 120 and the operation maintaining unit 130 to then drive the contactor 150. When there is a signal input from at least one of the controller 120, the operation maintaining unit 130, or the contactor driver 140 may drive the contactor 150. In other words, the contactor driver 140, including an OR logic device, may perform an OR logic operation on the contactor control signal and the retention control signal. According to some example embodiments, if at least one of the contactor control signal or the retention control signal is at a high level, the contactor driver 140 may drive (close) the contactor 150. In addition, if the contactor control signal and the retention control signal are both at a low level, the contactor driver 140 may stop driving (that is, may open) the contactor 150.

The operating state of the contactor 150 may be changed by the contactor driver 140. The contactor driver 140 may change the operating state of the contactor 150 based on the contactor control signal of the controller 120 or the retention output signal of the operation maintaining unit 130.

The contactor 150 may mean a variety of switching means for switching an electrical connection between two nodes. For example, the contactor 150 may include a relay as a low-speed operating switch and an FET or a transistor as a high-speed operating switch. In addition, according to some example embodiments of the present disclosure, the contactor 150 of may have an open state and a close state. The open state may mean a state in which an electrical connection between two contact points connected to the contactor 150 is canceled, that is, an OFF state. In addition, the close state may mean a state in which two contact points connected to the contactor 150 are electrically connected, that is, an ON state (or a conducting or shorted state). The two nodes connected to the contactor 150 may be a power supply node and a load node in an electrical device. In other words, the contactor 150 may be arranged along a high-current path of an electronic device to then be used to control a high current.

As described above, in the contactor operating state maintaining device 100 according to some example embodiments, when an abnormality occurs to the controller 120, the operation maintaining unit 130 may operate to prevent the contactor 150 from being abruptly opened for a preset time. According to some example embodiments, the contactor operating state maintaining device 100, which includes three-stage input signal level shifters 131, 132 and 133, is an ultrahigh-speed operating device having a low or minimized processing speed and may be capable of preventing or reducing instances of the contactor 150 being at an unintended open state for a period of the preset time.

In addition, in the contactor operating state maintaining device 100 according to some example embodiments, when an abnormality occurs to the controller 120, the operation maintaining unit 130 may operate to actuate the contactor 150 and may terminate its operation if the controller 120 returns to the normal state before the preset time elapses. Therefore, in the contactor operating state maintaining device 100 according to some example embodiments, even if the operation maintaining unit 130 is maintained at an operating state, as necessary, the operation of the operation maintaining unit 130 may be immediately stopped, thereby controlling the battery system to be at a more secured and efficient state.

Figure 2A:
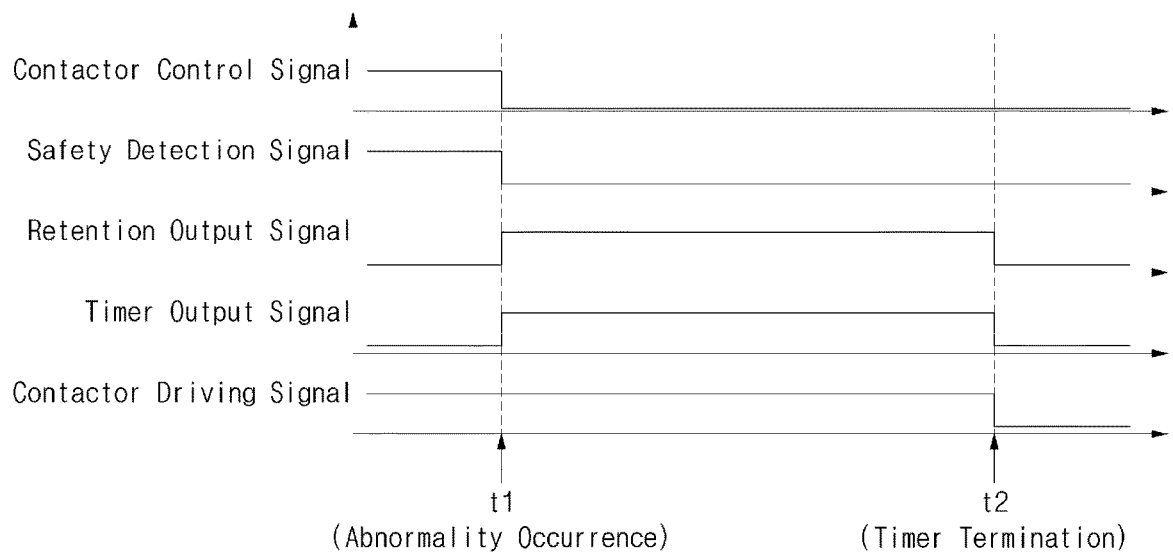
FIGS. 2A and 2B are timing diagrams for explaining an operation of the contactor operating state maintaining device according to some example embodiments.
Figure 2B:
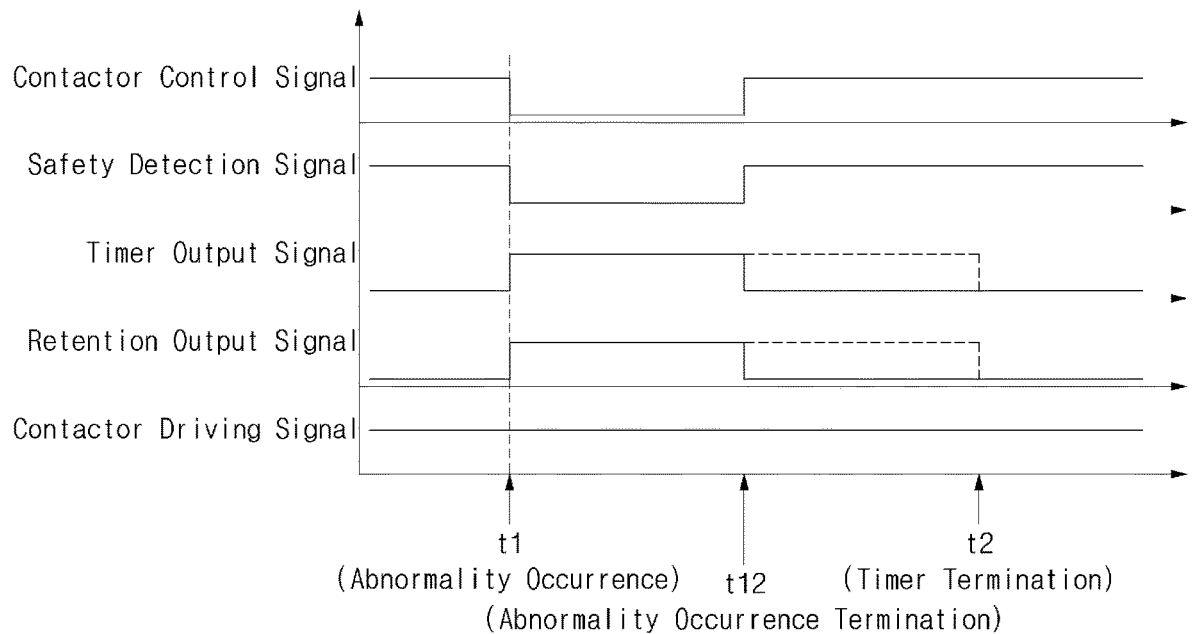

FIGS. 2A and 2B are timing diagrams for explaining an operation of the contactor operating state maintaining device according to some example embodiments.

First, a method of operating the contactor operating state maintaining device 100 when an abnormality occurs to the controller 120 will be described with reference to FIG. 2A.

As illustrated in FIG. 2A, at a time (<0) prior to occurrence of an abnormality, the contactor control signal of the controller 120 controlling the contactor 150 may be normally output. According to some example embodiments, when the controller 120 is at a normal state, the contactor control signal may be a high-level signal for controlling the contactor 150 to be at a close state. In addition, the system basis unit 110 may sense the normal state of the controller 120, and thus the safety detection signal may be normally output. Here, when the controller 120 is at a normal state and the safety detection signal is normally output, the safety detection signal may be at a high level. Because the controller 120 normally operates, the operation maintaining unit 130 does not operate, and thus the retention output signal may be at a low level. In addition, because the operation maintaining unit 130 does not operate, the timer output signal of the timer output unit 136 may be at a low level. In addition, after receiving the contactor control signal from the controller 120, the contactor driver 140 may output a contactor driving signal as a high level signal to then drive the contactor 150.

Thereafter, when the abnormality occurs to the controller 120 at a time t1, the safety detection signal is converted from high to low, and the contactor control signal is also converted from high to low. In addition, if the safety detection signal and the contactor control signal are both at a low level, the retention output unit 135 may output the retention output signal, and the retention output signal may be at a high level. If the retention output signal is at a high level, the timer 134 may be driven to make the timer output signal go high. Therefore, because the retention output signal is at a high level even if the contactor control signal is at a low level, the contactor driver 140 may maintain the contactor driving signal to be at the high level, and thus may continue to drive the contactor 150 to be in a closed state.

Next, at a time t2, the time set by the timer 134 elapses to terminate the timer 134, and thus the timer output signal may be at a low level. When the timer output signal is at a low level, the retention output signal may go low. Therefore, the contactor driver 140 may converts the contactor driving signal to a low level to stop driving the contactor 150, that is, to change the contactor 150 to be at an open state.

Next, a method of operating the contactor operating state maintaining device 100 when the controller 120 returns to the original state before the preset time elapses after an abnormality occurs to the controller 120 will be described in more detail with reference to FIG. 2B. As illustrated in FIG. 2B, because the operations at the time prior to the occurrence of abnormality (<t1) and at the time t1 of the occurrence of abnormality are the same as described above, and the next operations will now be described in more detail.

A time t12 refers to a point in time when the abnormality occurrence is terminated after the time t2 set by the timer 134 elapses. If the controller 120 returns to the normal state at time t12, the system basis unit 110 senses this situation to convert the safety detection signal from low to high. In addition, the contactor control signal may also be converted from low to high. If the contactor control signal and the safety detection signal are both at a high level, the timer output signal of the timer output unit 136 may also go low by the third level shifter 133. Therefore, even if the termination time t2 set by the timer 134 has not elapsed, the retention output signal may be converted from high to low, thereby terminating the operation of the operation maintaining unit 130. In addition, because the contactor control signal is at a high level even if the retention output signal is at a low level, the contactor driver 140 may maintain the contactor driving signal to be at a high level, and thus may continue to drive the contactor 150 to be in a closed state.

Figure 3A:
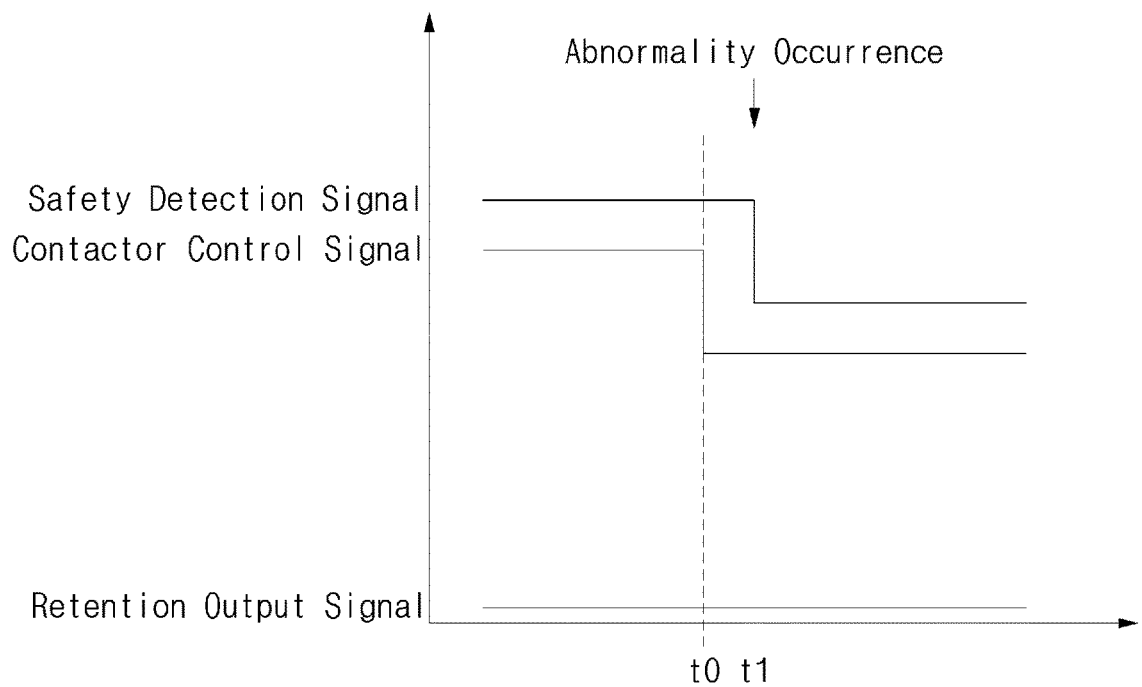
FIGS. 3A and 3B are diagrams for explaining an operating state of an operation maintaining unit according to some example embodiments.
Figure 3B:
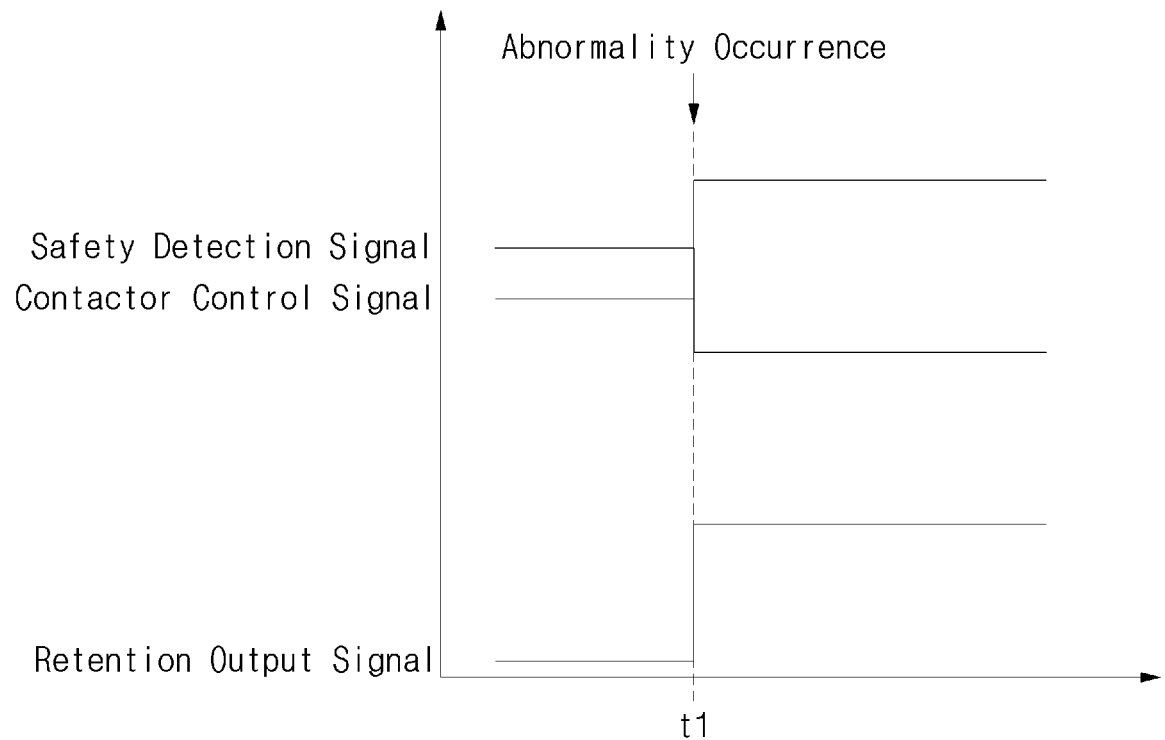

FIGS. 3A and 3B are diagrams for explaining an operating state of an operation maintaining unit.

Referring to FIG. 3A, at a time (<t0) prior to a time t0, the controller 120 normally operates to output the safety detection signal as a high level signal. In addition, the contactor control signal being at a high level may drive the contactor 150 to be at a close state. According to some example embodiments, the first level shifter 131 may set the voltage level of the safety detection signal to be higher than that of the contactor control signal and lower than a power voltage level (3.3 V), and, when the contactor control signal and the safety detection signal are input, may set the retention output unit 135 to be always at an OFF state, that is, not to output the retention output signal.

At the time t0, the controller 120 may output a signal for driving the contactor 150 to be at an open state, and thus the contactor control signal may go low. Here, because the controller 120 normally operates to control the contactor 150 to be in an open state, the safety detection signal may be continuously maintained at the high level.

At the time t1, although an abnormality may occur in the controller 120 and the safety detection signal goes low, the voltage level of the safety detection signal may still be set by the first level shifter 131 to be higher than that of the contactor control signal. Therefore, the retention output unit 135 may be at an OFF state, and the retention output signal may not be output.

Referring to FIG. 3B, at the time (<0) prior to the time t1, the controller 120 normally operates. Thus, the safety detection signal may be output as a high level signal, and the contactor control signal may go high to drive the contactor 150 to be at a close state. Therefore, the retention output unit 135 may be at an OFF state, and the retention output signal may not be output.

At the time t1, the abnormality may occur in the controller 120, and thus the safety detection signal may go low. However, the contactor control signal may be at a high level due to a delay caused by a buffering operation of the second level shifter 132. Therefore, the retention output unit 135 may be turned on to thus output the retention output signal. In addition, as soon as the retention output unit 135 is turned on, the second level shifter 132 may up-shift the voltage level of the contactor control signal to the power voltage level (3.3 V) to set the retention output unit 135 to be always at an ON state.

Figure 4A:
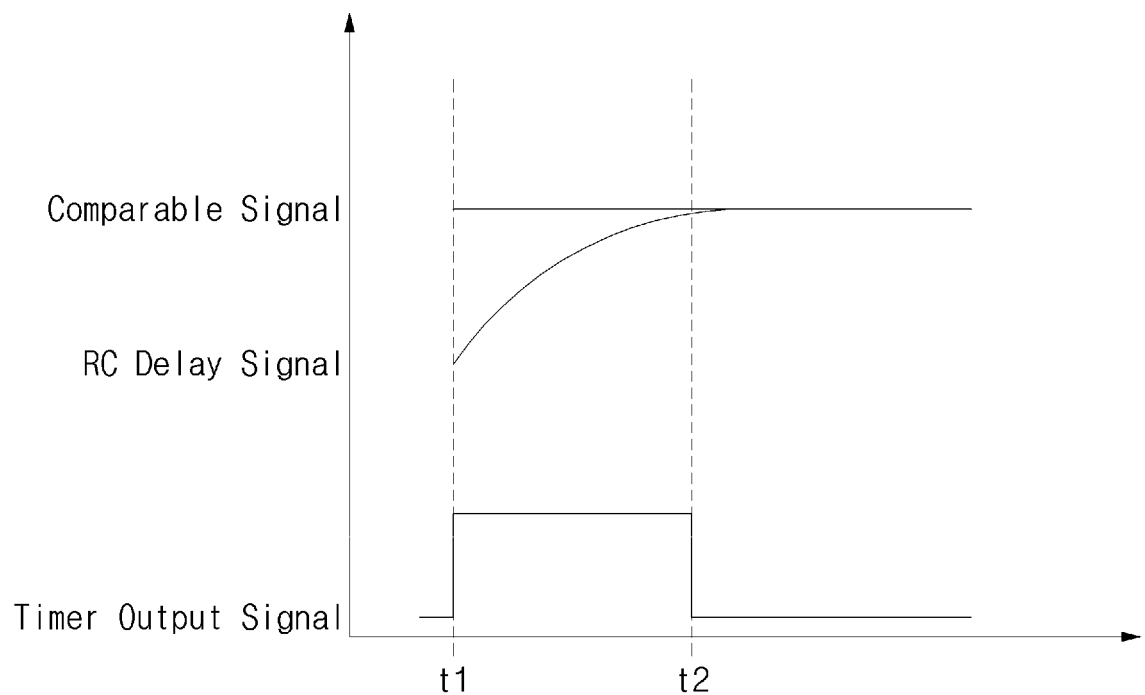

FIGS. 4A and 4B are diagrams for explaining an operating state of a timer output unit according to some example embodiments.

Referring to FIG. 4A, the abnormality occurs to the controller 120 at the time t1, and thus the retention output unit 135 may output the retention output signal and the timer output signal goes high. Here, the RC timer may be actuated in the timer 134, and thus the level of the RC delay signal output from the timer 134 gradually increases. At the time t2, the RC delay signal level may reach the comparable signal level of the timer output unit 136, and thus the timer output signal may be converted from high to low. A point in the time t2 may mean that the time set by the timer 134 is terminated, and the timer output signal may go low to interrupt the retention output signal.

Referring to FIG. 4B, the abnormality occurs to the controller 120 at the time t1, and thus the retention output unit 135 may output the retention output signal and the timer output signal may be converted from low to high. Here, the RC timer may be actuated in the timer 134, and thus the level of the RC delay signal output from the timer 134 may gradually increase. Here, the RC timer is actuated in the timer 134, and thus the level of the RC delay signal output from the timer 134 may gradually increase. Meanwhile, if the controller 120 returns to the normal state at the time t12, the third level shifter 133 changes the level of the comparable signal of the timer output unit 136 to be lower than that of the RC delay signal. Therefore, even before the time set by the timer 134 has reached, the timer output signal may go low to interrupt the retention output signal.

As described above, in the contactor operating state maintaining device 100 according to some example embodiments of the present disclosure, when an abnormality occurs to the controller 120, the operation maintaining unit 130 may operate, and then the controller 120 may return to the normal state even before the preset time elapses, thereby terminating the operation of the operation maintaining unit 130.

While the foregoing embodiment has been described to practice the contactor operating state maintaining device of embodiments according to the present disclosure, it will be understood by those of ordinary skill in the art that various changes in form and details may be made therein without departing from the spirit and scope of the present disclosure as defined by the following claims and their equivalents.

What is claimed is:

1. A contactor operating state maintaining device comprising:
 a controller configured to output a contactor control signal for controlling an operation of a contactor;
 a system basis unit configured to monitor a state of the controller and to output a safety detection signal;
 an operation maintaining unit including a first level shifter configured to shift a voltage level of the safety detection signal, a second level shifter configured to shift a voltage level of the contactor control signal, a retention output unit configured to compare the voltage level of the first level shifter with the voltage level of the second level shifter and to output a retention output signal, and a timer output unit configured to output a timer output signal to output the retention output signal for a preset time; and
 a contactor driver configured to output a contactor driving signal based on the contactor control signal and the retention output signal,
 wherein the contactor driver is configured to perform an OR logic operation on the contactor control signal and the retention output signal and to output the contactor driving signal corresponding to a result of the OR logic operation.

2. The contactor operating state maintaining device of claim 1, wherein the first level shifter is configured to set the voltage level of the safety detection signal to be higher than that of the contactor control signal and lower than a power voltage level, and to set the retention output unit to be at an OFF state in response to the safety detection signal and the contactor control signal both being at a high level.

3. The contactor operating state maintaining device of claim 1, wherein in response to the retention output unit being turned on to output the retention output signal, the second level shifter is configured to up-shift the voltage level of the contactor control signal to a power voltage level to set the retention output unit to be at an ON state.

4. The contactor operating state maintaining device of claim 1, wherein the second level shifter is configured to delay the contactor control signal.

5. The contactor operating state maintaining device of claim 1, wherein in response to an abnormality occurring in the controller, the contactor control signal is converted from high to low, the system basis unit is configured to sense the conversion to then convert the safety detection signal from high to low, and the retention output unit is configured to output the retention output signal as a high level signal.

6. The contactor operating state maintaining device of claim 1, further comprising:
 a timer configured to actuate an RC timer based on the retention output signal and to output an RC delay signal; and
 a third level shifter configured to shift a comparable signal level of the timer output unit based on the safety detection signal and the contactor control signal.

7. The contactor operating state maintaining device of claim 6, wherein in response to an abnormality of the controller being terminated while the timer is still operating, and the safety detection signal and the contactor control signal are both at a high level, the third level shifter is configured to set the comparable signal level of the timer output unit to be lower than a level of the RC delay signal.

8. The contactor operating state maintaining device of claim 7, wherein in response to the comparable signal level of the timer output unit being lower than the level of the RC delay signal, the output of the timer output unit is turned off and the output of the retention output unit is interrupted.

* * * * *